United States Patent
Zhang et al.

(10) Patent No.: US 12,374,173 B2
(45) Date of Patent: Jul. 29, 2025

(54) SYSTEM AND METHOD FOR CONTACTOR STATUS CHECK FOR ELECTRIFIED VEHICLE

(71) Applicant: FORD GLOBAL TECHNOLOGIES, LLC, Dearborn, MI (US)

(72) Inventors: Yuan Zhang, Canton, MI (US); Rui Wang, Canton, MI (US); Xu Wang, Northville, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 1501 days.

(21) Appl. No.: 16/589,846

(22) Filed: Oct. 1, 2019

(65) Prior Publication Data

US 2021/0097785 A1 Apr. 1, 2021

(51) Int. Cl.
G07C 5/08 (2006.01)
B60L 50/60 (2019.01)
B60L 58/10 (2019.01)
G01R 31/364 (2019.01)

(52) U.S. Cl.
CPC .......... G07C 5/0808 (2013.01); B60L 50/60 (2019.02); B60L 58/10 (2019.02); G01R 31/364 (2019.01)

(58) Field of Classification Search
CPC ..... G07C 5/0808; G01R 31/364; B60L 50/60; B60L 58/10
See application file for complete search history.

(56) References Cited

U.S. PATENT DOCUMENTS

| | | | |
|---|---|---|---|
| 8,791,681 B2 | 7/2014 | Akaishi et al. | |
| 9,755,417 B2 | 9/2017 | Siciak et al. | |
| 10,017,071 B2* | 7/2018 | Namou | H02J 7/34 |
| 10,107,847 B2* | 10/2018 | Chang | G01R 27/205 |
| 2001/0048226 A1* | 12/2001 | Nada | F02N 11/04 |
| | | | 290/40 C |
| 2012/0105065 A1* | 5/2012 | Namou | G01R 31/3278 |
| | | | 324/415 |
| 2013/0035819 A1* | 2/2013 | Wolft | B60L 3/0046 |
| | | | 701/22 |
| 2013/0314012 A1* | 11/2013 | Cho | B60L 3/003 |
| | | | 318/400.21 |
| 2014/0046520 A1* | 2/2014 | Katoch | B60W 50/035 |
| | | | 903/930 |
| 2014/0288772 A1* | 9/2014 | Makabe | G07C 5/0808 |
| | | | 701/36 |
| 2015/0191088 A1* | 7/2015 | Gonzales | G01R 31/3278 |
| | | | 701/34.2 |
| 2015/0270081 A1* | 9/2015 | Hartl | G01R 31/3278 |
| | | | 361/170 |
| 2015/0276842 A1* | 10/2015 | Chang | G01R 27/205 |
| | | | 324/503 |
| 2017/0144554 A1* | 5/2017 | Mifsud | H01H 47/02 |

(Continued)

Primary Examiner — Naeem Taslim Alam
(74) Attorney, Agent, or Firm — David B. Kelley; Brooks Kushman P.C.

(57) ABSTRACT

A power distribution system includes a contactor between a traction battery and a high-voltage bus. The system includes a controller configured to generate a contactor status to determine if the contactor is operating as commanded. The controller identifies a contactor as closed responsive to a rate of change of a voltage difference between a traction battery voltage and a high-voltage bus voltage over each of a predetermined number of time intervals being within a predetermined range.

19 Claims, 4 Drawing Sheets

(56) References Cited

U.S. PATENT DOCUMENTS

| | | | | |
|---|---|---|---|---|
| 2017/0355350 A1* | 12/2017 | Namou | ............... | B60L 50/60 |
| 2018/0134169 A1* | 5/2018 | Loftus | ............... | H02J 7/00712 |
| 2018/0272870 A1* | 9/2018 | Burkman | ............... | H02H 9/001 |
| 2018/0315568 A1* | 11/2018 | Zhao | ............... | G08B 21/185 |
| 2020/0025832 A1* | 1/2020 | Cho | ............... | G01R 31/392 |
| 2020/0086743 A1* | 3/2020 | Jala | ............... | B60L 50/60 |
| 2020/0134944 A1* | 4/2020 | Yumoto | ............... | G01R 31/3278 |

\* cited by examiner

SYSTEM AND METHOD FOR CONTACTOR STATUS CHECK FOR ELECTRIFIED VEHICLE

TECHNICAL FIELD

This application generally relates to detecting a status of a contactor between a traction battery and a high-voltage power bus in a vehicle.

BACKGROUND

Electrified vehicles include high-voltage components that are connected to a high-voltage bus. The high-voltage bus may include elements that selectively isolate the high-voltage components from one another. During normal conditions, the selective isolation elements may operate as commanded. However, under abnormal conditions, the selective isolation elements may be in state other than the commanded state.

SUMMARY

A vehicle includes a traction battery and a contactor configured to selectively electrically couple a terminal of the traction battery to terminal of a high-voltage bus. The vehicle further includes a controller programmed to command the contactor to open at an end of an ignition cycle and, responsive to a rate of change of a voltage difference between the traction battery and the high-voltage bus for each of a first predetermined number of consecutive time intervals being within a predetermined range, cause a display to show a status indicator to indicate the contactor is welded closed during a subsequent ignition cycle, and, responsive to the rate of change for each of a second predetermined number of consecutive time intervals falling outside the predetermined range, enter a shutdown mode without causing the display to show the status indicator for the subsequent ignition cycle.

The values defining the predetermined range may be based on values of a resistance and a capacitance that are coupled to the high-voltage bus through which the high-voltage bus is passively discharged when the contactor is opened. The first predetermined number of consecutive time intervals and the second predetermined number of consecutive time intervals may each define a duration that is less than a time for a voltage of the high-voltage bus voltage to decay from a voltage of the traction battery to below a predetermined low-voltage threshold. The controller may be further programmed to store a diagnostic code responsive to the rate of change for each of the first predetermined number of consecutive time intervals being within the predetermined range. The controller may be further programmed to evaluate the rate of change between consecutive voltage measurements. The controller may be further programmed to evaluate the rate of change between averages of two groups of voltage differences that include more than one voltage measurement. The second predetermined number of consecutive time intervals may be less than the first predetermined number of consecutive time intervals. The controller may be further programmed to, responsive to a voltage of the high-voltage bus falling below a predetermined low-voltage threshold, enter the shutdown mode without causing the display to show the status indicator for the subsequent ignition cycle.

A power distribution system for a vehicle includes a contactor configured to selectively electrically couple a terminal of a traction battery to a corresponding terminal of a high-voltage bus. The power distribution system further includes a controller programmed to command the contactor to transition from closed to open and, responsive to a rate of change of a difference between an average of a first set of voltage differences and an average of a second set of voltage differences being within a predetermined range over each of a predetermined number of time intervals, cause a display in the vehicle to show a status indicator indicative of the contactor being welded closed, wherein the voltage differences are between a traction battery voltage and a high-voltage bus voltage.

The first set of voltage differences are consecutive measurements over a first time interval and the second set of voltage differences may be consecutive measurements over a second time interval. The second time interval may immediately follow the first time interval. The first time interval and the second time interval may include a same number of voltage measurements. The values defining the predetermined range may be based on values of a resistance and a capacitance that are coupled to the high-voltage bus through which the high-voltage bus is passively discharged when the contactor is opened. The predetermined number of time intervals may define a duration that is less than a time for the high-voltage bus voltage to decay to less than a predetermined low-voltage threshold. The controller may be further programmed to, responsive to the rate of change over each of a second predetermined number of time intervals falling outside of the predetermined range, cause the controller to enter a low-power mode without causing the display to show the status indicator. The second predetermined number of time intervals may be different than the predetermined number of time intervals.\

A method includes commanding, by a controller, a contactor disposed between a terminal of a traction battery and a terminal of a high-voltage bus to transition from closed to open. The method further includes outputting, by the controller, to a display a status indicator indicative of a welded contactor responsive to a rate of change of a voltage difference between a traction battery and a high-voltage bus over each of a predetermined number of consecutive time intervals being within a predetermined range that varies according to values of a resistance and a capacitance that are coupled to the high-voltage bus through which the high-voltage bus passively discharges when the contactor is opened.

The method may further include entering a controller shutdown mode without outputting the status indicator responsive to the rate of change of the voltage difference over each of a second predetermined number of consecutive time intervals falling outside of the predetermined range. The second predetermined number of consecutive time intervals may be different than the predetermined number of consecutive time intervals. The predetermined number of consecutive time intervals may define a duration that is less than a time for the high-voltage bus voltage to decay below a low-voltage threshold.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Electrified vehicles include contactors to selectively connect and isolate high-voltage components. The contactors may be electromagnetic switches such as relays. In a high-voltage environment, switches can experience high levels of stress. The high voltages present in an electrified vehicle can cause an electrical arc between the switch contacts. The electrical arcing may occur as the switch opens or closes. The temperature of the electrical arc can be high enough to cause the switch contacts to melt. In some cases, the contactor can become welded closed.

Figure 1:
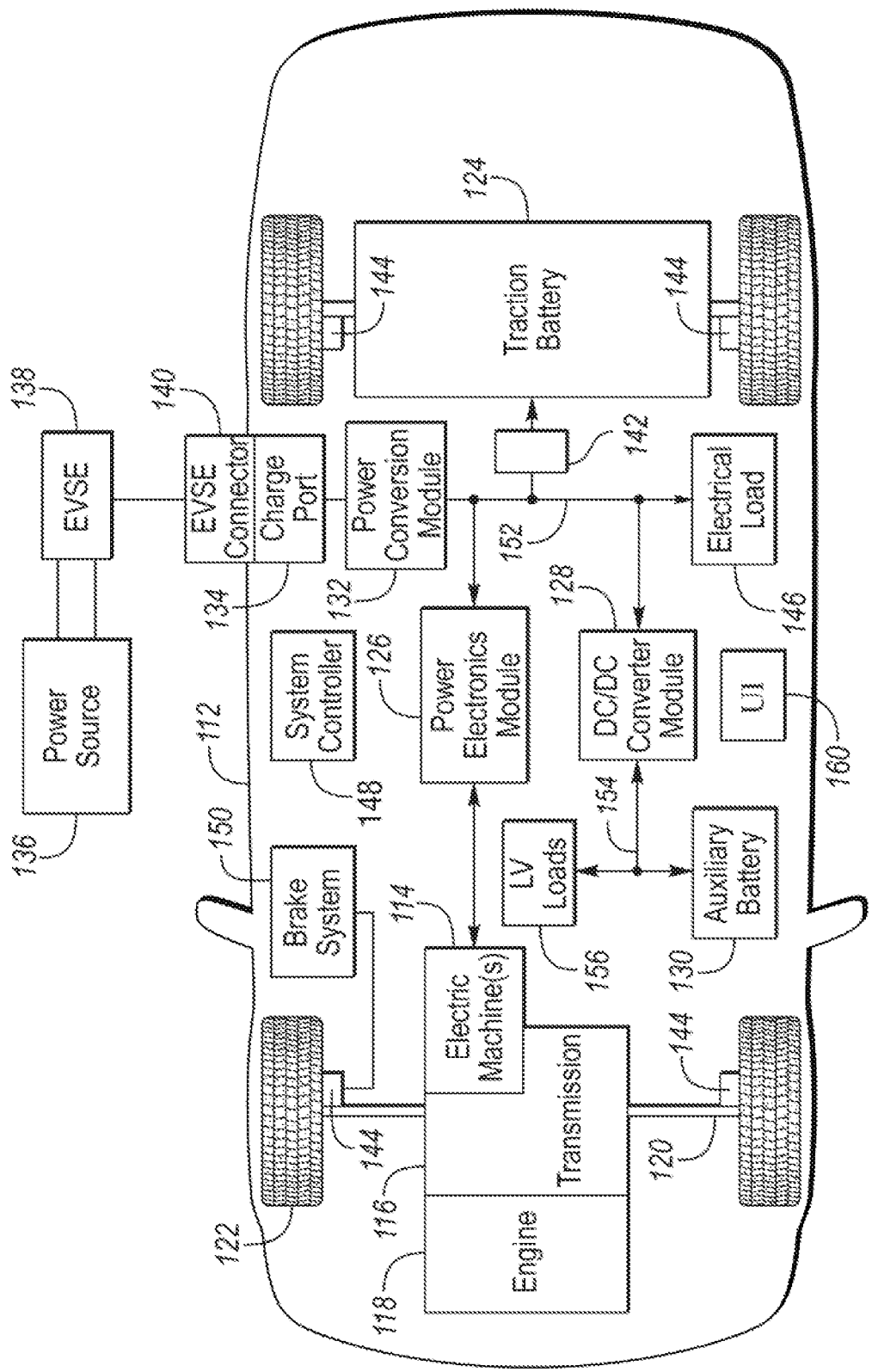
FIG. 1 depicts a possible configuration for an electrified vehicle.

FIG. 1 depicts an electrified vehicle 112 that may be referred to as a plug-in hybrid-electric vehicle (PHEV). A plug-in hybrid-electric vehicle 112 may comprise one or more electric machines 114 mechanically coupled to a gearbox or hybrid transmission 116. The electric machines 114 may be capable of operating as a motor and a generator. In addition, the hybrid transmission 116 is mechanically coupled to an engine 118. The hybrid transmission 116 is also mechanically coupled to a drive shaft 120 that is mechanically coupled to the wheels 122. The electric machines 114 can provide propulsion and regenerative braking capability when the engine 118 is turned on or off. The electric machines 114 may also act as generators and can provide fuel economy benefits by recovering energy that would normally be lost as heat in a friction braking system. The electric machines 114 may also reduce vehicle emissions by allowing the engine 118 to operate at more efficient speeds and allowing the electrified vehicle 112 to be operated in electric mode with the engine 118 off under certain conditions. An electrified vehicle 112 may also be a battery electric vehicle (BEV). In a BEV configuration, the engine 118 may not be present. In other configurations, the electrified vehicle 112 may be a full hybrid-electric vehicle (FHEV) without plug-in capability.

A battery pack or traction battery 124 stores energy that can be used by the electric machines 114. The traction battery 124 may provide a high voltage direct current (DC) output. A contactor module 142 may include one or more contactors configured to isolate the traction battery 124 from a high-voltage bus 152 when opened and connect the traction battery 124 to the high-voltage bus 152 when closed. The high-voltage bus 152 may include power and return conductors for carrying current over the high-voltage bus 152. The contactor module 142 may be located in the traction battery 124.

One or more power electronics modules 126 (also known as an inverter) may be electrically coupled to the high-voltage bus 152. The power electronics modules 126 are also electrically coupled to the electric machines 114 and provide the ability to bi-directionally transfer energy between the traction battery 124 and the electric machines 114. For example, a traction battery 124 may provide a DC voltage while the electric machines 114 may operate with a three-phase alternating current (AC) to function. The power electronics module 126 may convert the DC voltage to a three-phase AC current to operate the electric machines 114. In a regenerative mode, the power electronics module 126 may convert the three-phase AC current from the electric machines 114 acting as generators to the DC voltage compatible with the traction battery 124.

In addition to providing energy for propulsion, the traction battery 124 may provide energy for other vehicle electrical systems. The vehicle 112 may include a DC/DC converter module 128 that converts the high voltage DC output from the high-voltage bus 152 to a low-voltage DC level of a low-voltage bus 154 that is compatible with low-voltage loads 156. An output of the DC/DC converter module 128 may be electrically coupled to an auxiliary battery 130 (e.g., 12V battery) for charging the auxiliary battery 130. The low-voltage loads 156 may be electrically coupled to the auxiliary battery 130 via the low-voltage bus 154. One or more high-voltage electrical loads 146 may be coupled to the high-voltage bus 152. The high-voltage electrical loads 146 may have an associated controller that operates and controls the high-voltage electrical loads 146 when appropriate. Examples of high-voltage electrical loads 146 may be a fan, an electric heating element and/or an air-conditioning compressor.

The electrified vehicle 112 may be configured to recharge the traction battery 124 from an external power source 136. The external power source 136 may be a connection to an electrical outlet. The external power source 136 may be electrically coupled to a charge station or electric vehicle supply equipment (EVSE) 138. The external power source 136 may be an electrical power distribution network or grid as provided by an electric utility company. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for coupling to a charge port 134 of the vehicle 112. The charge port 134 may be any type of port configured to transfer power from the EVSE 138 to the vehicle 112. The charge port 134 may be electrically coupled to an on-board power conversion module or charger. The charger 132 may condition the power supplied from the EVSE 138 to provide the proper voltage and current levels to the traction battery 124 and the high-voltage bus 152. The charger 132 may be electrically coupled to the contactor module 142. The charger 132 may interface with the EVSE 138 to coordinate the delivery of power to the vehicle 112. The EVSE connector 140 may have pins that mate with corresponding recesses of the charge port 134. Alternatively, various components described as being electrically coupled or connected may transfer power using a wireless inductive coupling.

Wheel brakes 144 may be provided for slowing the vehicle 112 and preventing motion of the vehicle 112. The wheel brakes 144 may be hydraulically actuated, electrically actuated, or some combination thereof. The wheel brakes 144 may be a part of a brake system 150. The brake system 150 may include other components to operate the wheel brakes 144. For simplicity, the figure depicts a single connection between the brake system 150 and one of the wheel brakes 144. A connection between the brake system 150 and the other wheel brakes 144 is implied. The brake system 150 may include a controller to monitor and coordinate the brake system 150. The brake system 150 may monitor the brake components and control the wheel brakes 144 for slowing the vehicle. The brake system 150 may respond to driver commands and may also operate autonomously to implement features such as stability control. The controller of the brake system 150 may implement a method of applying a requested brake force when requested by another controller or sub-function.

Electronic modules in the vehicle 112 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 130. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 1, but it may be implied that the vehicle network may connect to any electronic modules that are present in the vehicle 112. A vehicle system controller (VSC) 148 may be present to coordinate the operation of the various components.

The electrified vehicle 112 may further include a user interface 160. The user interface 160 may provide a variety of display elements for communicating information to the operator. The user interface 160 may provide a variety of input elements for receiving information from the operator. The user interface 160 may include one or more displays. The displays may be touch-screen displays. The user interface 160 may include discrete lamps/lights. For example, the lamps may include light-emitting diodes (LED). The user interface 160 may include switches, rotary knobs, and buttons for allowing the operator to change various settings. The user interface 160 may include a control module that communicates via the vehicle network. The user interface 160 may provide one or more display elements that are indicative of charging being inhibited and vehicle operation being inhibited. The user interface 160 may also provide display elements for indicating a status of the contactor module 142. The display elements may include discrete lamps and/or messages in a message display area. The user interface 160 may also include a diagnostic terminal that permits access to stored controller data using a diagnostic tool or other device. For example, the diagnostic terminal may allow the user or technician to retrieve diagnostic codes that are stored in the vehicle controllers.

Figure 2:
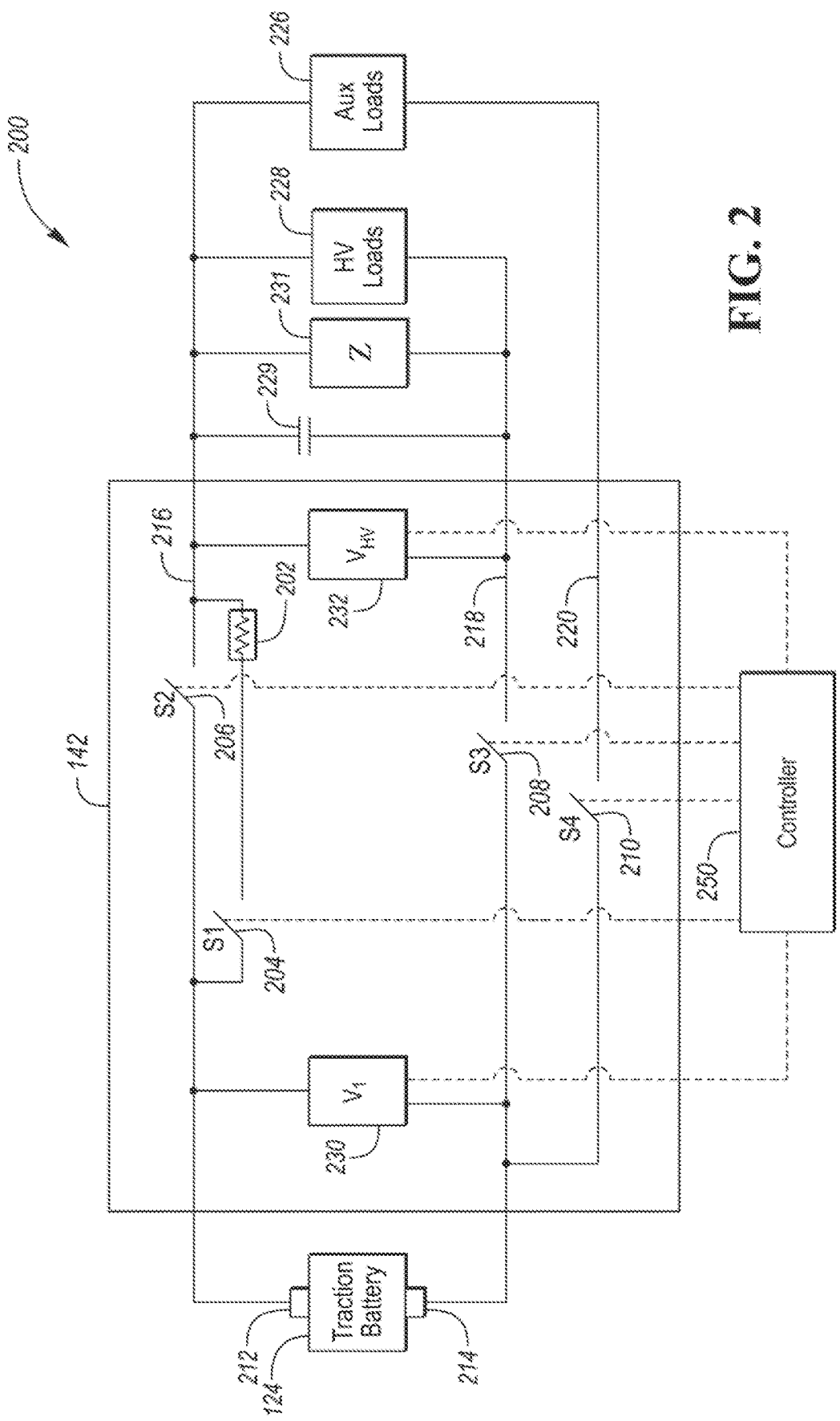
FIG. 2 depicts a possible configuration for contactors in a high-voltage power distribution system for a vehicle.

FIG. 2 depicts a configuration of a high-voltage power distribution system 200 for a vehicle including a plurality of contactors. The contactor module 142 may include a pre-charge contactor 204 (S1) that is electrically coupled in series with a pre-charge resistor 202. The pre-charge resistor 202 may limit the current flowing through the high-voltage bus 152 during startup when the traction battery 124 is initially connected to the high-voltage bus 152. The contactor module 142 may include a main contactor 206 (S2) that is configured to selectively electrically couple a positive terminal 212 of the traction battery 124 to a positive-side conductor 216 of the high-voltage bus 152. The contactor module 142 may include a high-voltage return contactor 208 (S3) that is configured to selectively electrically couple a traction battery return terminal 214 (return terminal of the traction battery 124) to a negative-side or return conductor 218 of the high-voltage bus 152 (e.g., return side of the power electronics module 126). The contactor module 142 may include an auxiliary load return contactor 210 (S4) that is configured to selectively electrically couple the traction battery return terminal 214 to an electrical load return conductor 220 to which an auxiliary load 226 may be connected.

One or more high-voltage loads 228 may be electrically coupled to the high-voltage bus 152. A capacitive element 229 and a discharge impedance 231 may also be electrically coupled across the high-voltage bus 152. The capacitive element 229 and the discharge impedance 231 may also represent the combined impedance associated with the high-voltage loads 228. The capacitive element 229 may hold charge and limit the decay rate of the HV-bus voltage. When disconnected from the high-voltage bus 152, the capacitive element 229 may discharge energy through the discharge impedance 231. Upon disconnection, the voltage across the high-voltage bus 152 may decay toward zero. In addition, the capacitive element 229 can cause large inrush currents at start up when not charged. Connection of the high-voltage loads 228 may be established by closing the high-voltage return contactor 208 and the main contactor 206 and/or the pre-charge contactor 204.

An auxiliary load 226 may also be electrically coupled between the positive-side conductor 216 and the high-voltage return conductor 220. Connection of the auxiliary load 226 may be established by closing the auxiliary load return contactor 210 and the main contactor 206 and/or pre-charge contactor 204. The auxiliary load 226 may include the DC/DC converter module 128 that drives the low-voltage bus 154.

The contactors 204, 206, 208, 210 may be electromagnetic switches such as a relay. The contactors may include a coil that opens or closes an associated switch when energized by a current flow. For example, the contactors 204, 206, 208, 210 may be normally-open contactors such that the switch is opened when the coil is de-energized and closed when the coil is energized. A coil may be energized by applying a voltage across the coil to cause current to flow in the coil. The coils may be electrically coupled to a controller 250 that is configured to provide voltage and current to the coils. In some configurations, the contactors may be solid-state devices such as an Insulated Gate Bipolar Transistor (IGBT) or similar device. The controller 250 may be configured to drive the coils using hardware components and software functions. The controller 250 may be part of the contactor module 142. In some configurations, features of the controller 250 may be performed by one or more external controllers (e.g., a battery control module controller and/or system controller 148). The controller 250 may include a processing unit for executing instructions and programs. The controller 250 may include volatile and non-volatile memory for storing programs and data. The controller 250 may include driver/interface circuitry for operating the contactors 204, 206, 208, 210.

The power distribution system 200 may include voltage sensors that are configured to measure voltages that are present. A battery voltage sensor 230 may be configured to measure a voltage across the traction battery 124 (battery voltage). A high-voltage bus voltage sensor 232 may be configured to measure a voltage across the high-voltage bus 152 (voltage across positive-side conductor 216 and the return conductor 218 (HV-bus voltage)). In addition, current sensors may be present that are configured to measure the current passing through conductors of the power distribution system 200. The controller 250 may include interface circuitry to properly scale and isolate the signals provided by the voltage and current sensors.

The contactors 204, 206, 208, 210 may be monitored to ensure an expected response to the commanded state. As the controller 250 operates the contactors 204, 206, 208, 210, the controller 250 may be aware of the desired or commanded state (e.g., open or closed) for each of the contactors 204, 206, 208, 210. When a contactor 204, 206, 208, 210 is not responding as commanded (e.g., closed when commanded to be open), the controller 250 may generate a diagnostic code to aid in servicing the vehicle. In addition, the controller 250 may inhibit vehicle operation functions including charging and propulsion. The controller 250 may also cause a display element that is descriptive of the condition to be displayed on the user interface 160.

A contactor may not respond as commanded due to being welded closed. For example, a contactor may become welded closed when trying to close the contactor in the presence of a large voltage across the contactor. As the contactor is closed, the large voltage may cause a current flow across the switch gap before the switch is fully closed. This current can create a temperature that may cause the conductive material to melt and fuse the contactor closed. The welded contactor may not respond in the expected manner to a change in the commanded state. The welded contactor may not respond to commands to open and may be permanently closed. As such, the system may be configured to detect a welded contactor and provide an indication to the operator.

The operation of the contactor status determination strategy will be described with reference to the main contactor 206. However, the strategy disclosed may be used to test any of contactors in the power distribution system. The status of the main contactor 206 may be determined by measuring and comparing a voltage from each side of the contactor poles with respect to a common reference. The voltage on a battery side of the main contactor 206 may be the voltage of the traction battery 124. The voltage on a load side of the main contactor 206 may be a voltage of the high-voltage bus 152. There may be a high likelihood of the main contactor 206 being closed if the voltages on each side are close in value. That is, a voltage difference across the main contactor 206 is expected to be near zero when the main contactor 206 is closed. There may be a low likelihood of the main contactor 206 being closed if the voltage difference exceeds a predetermined threshold.

The high-voltage loads 228 may include an active discharging system coupled to the high-voltage bus 152. The active discharging system may be configured to discharge the high-voltage bus 152 to a low voltage when the main contactor 206 is opened. The active discharging system may be configured to discharge the high-voltage bus 152 to less than a predetermined voltage (e.g., 60 Volts) within a predetermined time (e.g., 1 second). The active discharging system may operate by activating an electrical load to draw a predetermined amount of current from the high-voltage bus 152 when the main contactor 206 is opened. The impedance of the active discharging load may be selected based on the desired discharge time.

When the active discharging system is not available, the high-voltage bus 152 may passively discharge. For example, the capacitive element 229 and the discharge impedance 231 that are coupled to the high-voltage bus 152 form an RC-circuit having a time constant that depends upon the resistance (R) and the capacitance (C) values. Passive discharging is typically slower than active discharging. For example, the resistance value of the discharge impedance 231 may result in discharging the high-voltage bus 152 to less than 60 Volts in a time exceeding 60 seconds. As a result, a comparison between voltages on each side of the main contactor 206 may result in an incorrect contactor status as the voltage on the high-voltage bus 152 slowly decays.

The controller 250 may wait for a predetermined time period (e.g., 60 seconds) after commanding the main contactor 206 to open to begin performing the contactor status check. The predetermined time period may be configured as a time at which the high-voltage bus voltage is expected to decay to a low-voltage level (e.g., 60V). For a welded contactor, the voltage on the high-voltage bus 152 may be approximately the same as the traction battery voltage. A voltage difference across the poles of the main contactor 206 may be near zero when the main contactor 206 is in a closed condition. The controller 250 may adapt a strategy of monitoring the voltage difference after the main contactor 206 is commanded to open and identify a welded contactor if the voltage difference is less than a predetermined voltage (e.g., 10% of pack voltage) for more than the predetermined time period. This strategy of waiting for the predetermined time period means that a welded contactor could take at least the predetermined time period to detect. In addition, the predetermined time period may be a heuristic value that depends on the architecture. That is, the amount of time required to discharge to below the predetermined voltage may change as different electrical loads are connected to the high-voltage bus. An improved strategy would allow detection of the welded contactor in less time.

Figure 3:
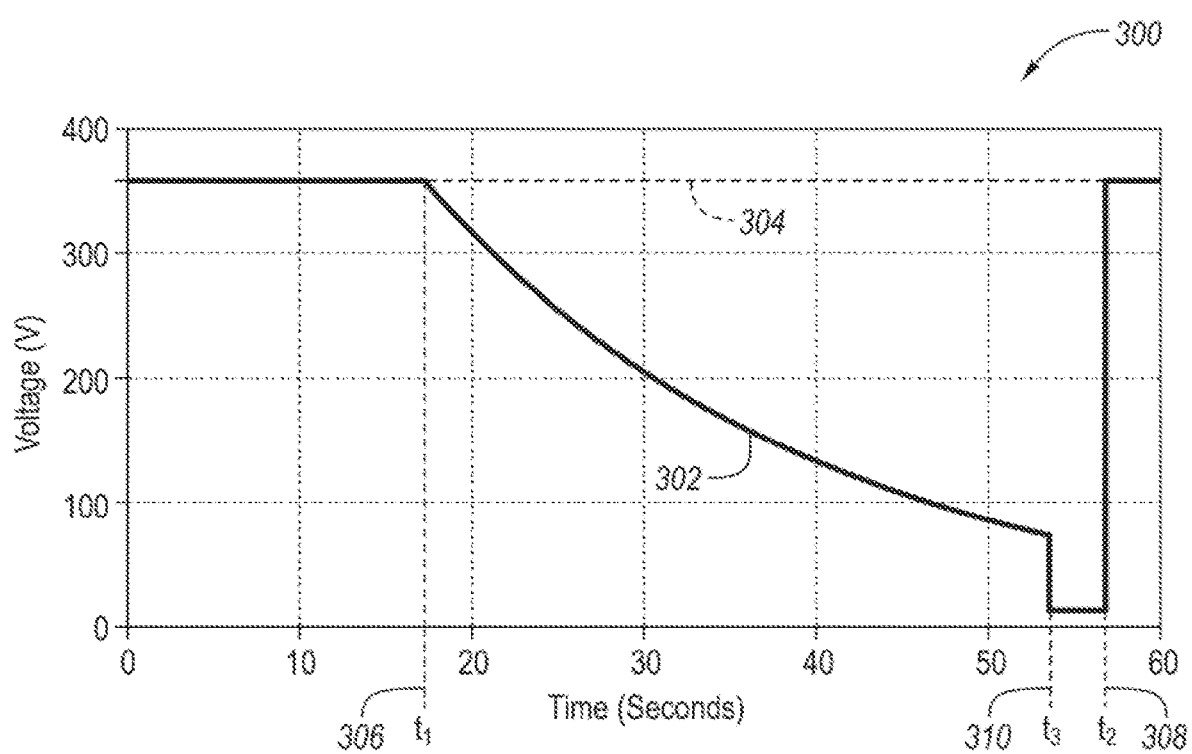
FIG. 3 depicts a possible voltage decay response of a high-voltage bus after being disconnected from a traction battery.

FIG. 3 depicts a possible graph 300 of the voltages when the main contactor 206 is opened and closed without an available active discharge system (e.g., passive discharging). The graph depicts a bus-side voltage curve 302 that represents the voltage of the high-voltage bus 152. The graph also depicts a battery-side voltage curve 304 that represents the voltage of the traction battery 124. At a time, $t_1$ 306, the main contactor 206 is commanded to open. Under normal conditions, the main contactor 206 opens. Prior to time, $t_1$ 306, the main contactor 206 is closed. When the main contactor 206 is closed, the bus-side voltage curve 302 and the battery-side voltage curve 304 are approximately equal. That is, the voltage difference across the contactor is approximately zero. After time, $t_1$ 306, the main contactor 206 opens and the bus-side voltage curve 302 begins to decay toward zero while the battery-side voltage curve 304 remains at the battery voltage level. After time, $t_1$ 306, a magnitude of a voltage difference between the battery-side voltage curve 304 and the bus-side voltage curve 302 increases. In this example, the bus-side voltage curve 302 decays to a low-voltage level in approximately 37 seconds.

At a time, $t_3$ 310, the voltage may fall below the low-voltage level and the controller may enter a sleep or shut-down state. The instantaneous drop to zero voltage at time, $t_3$ 310, may be the result of the controller being inactive and ceasing to take voltage measurements. The actual voltage may continue to decay toward zero. In the sleep or shutdown state, all systems of the electrified vehicle 112 may be in a low-power mode to reduce power usage. The sleep or shutdown state may be triggered by an ignition switch transitioning to an off position. The sleep or shutdown state may be triggered by completion of charging of the traction battery 124.

At a time $t_2$ 308, the main contactor 206 is commanded to close resulting in the bus-side voltage curve 302 returning to approximately the same voltage as the battery-side voltage curve 304. At time $t_2$ 308, a system wakeup may occur for charging the vehicle or initiating an ignition cycle.

The voltage difference between the high-voltage bus 152 and the traction battery 124 may be defined as:

$$V_{diff}[k]=(V_{bus\_pos}[k]-V_{batt\_low}[k])-(V_{batt\_hi}[k]-V_{batt\_low}[k])=V_{bus\_pos}[k]-V_{batt\_hi}[k] \quad (1)$$

where $V_{bus\_pos}$ is a voltage measured at the positive terminal 216 of the high-voltage bus, $V_{batt\_low}$ is a voltage at a negative or return terminal 214 of the traction battery 124, and $V_{batt\_hi}$ is a voltage at a positive terminal 212 of the traction battery 124.

A gradient or rate of change of the voltage difference over a time interval may be defined as:

$$\frac{dVdiff}{dt}[k+2n_{sample}-1] = \frac{\left(\sum_{t=k}^{t=k+n_{sample}-1} V_{diff}[t] - \sum_{t=k+n_{sample}}^{t=k+2n_{sample}-1} V_{diff}[t]\right)/n_{sample}}{n_{sample}T_{sample}} \quad (2)$$

where $T_{sample}$ is the time interval between samples and $n_{sample}$ is the number of samples in the time interval. The expression for dVdiff/dt calculates the slope of the $V_{diff}$ curve using a difference between two consecutive samples or groups of samples. The dVdiff/dt equation can be fine-tuned by selecting the value for $n_{sample}$. By selecting a number of samples greater than one, the difference becomes a difference between averaged groups of consecutive voltage samples. Increasing the number of samples value may prevent noisy signals from affecting the contactor status determination.

The dVdiff/dt equation computes a slope of adjacent groups of voltage difference measurements. Each of the groups may include consecutive voltage difference measurements or calculations. Each group may be averaged by the number of samples present in the group. When the number of samples is set to one, the dVdiff/dt equation computes the slope between adjacent voltage difference measurements.

The main contactor status may be considered as closed when the following is satisfied:

$$\forall \delta \in [0, n_{test}] = z: \frac{dVdiff}{dt}[k+2n_{sample}-1+\delta] \in [e_1, e_2] \quad (3)$$

where $n_{test}$ is a number of tests to perform to confirm the contactor status. The terms $e_1$ and $e_2$ may be calibratable values such that $e_1<0$ and $e_2>0$. The terms $e_1$ and $e_2$ may be computed from the circuit impedance characteristics (e.g., Resistance/Capacitance time constant). The default values may be such that $e_1$ is equal to negative $e_2$. An exact value for $e_1$ may be determined via a high-voltage circuit architecture analysis.

The contactor status may be considered opened when the following is satisfied:

$$\forall \delta \in [0, n_{test}] = z: \frac{dVdiff}{dt}[k+2n_{sample}-1+\delta] \notin [e_1, e_2] \quad (4)$$

Note that $n_{test}$ may be assigned a different value for the opened and closed tests (e.g., $n_{open}$, $n_{close}$). In some configurations, $n_{open}$ may be configured to be less than $n_{close}$.

As an example, $n_{sample}$ may be set to 1 with a $T_{sample}$ of 0.01 seconds. The value of $n_{test}$ may be set to 100 and $e_1$ may be set to $-e_2$. For each sample, the voltage difference, $V_{diff}$, may be computed. The voltage rate expression in this example is the following:

$$\frac{dVdiff}{dt}[k+1] = \frac{V_{diff}[k] - V_{diff}[k+1]}{0.01} \quad (5)$$

The dVdiff/dt value is computed for $n_{test}$ (100) number of voltage measurements. Each dVdiff/dt value may be compared to the acceptable range defined by $e_1$ and $e_2$. If the slope is outside of the range defined by $e_1$ and $e_2$ for each test value, the main contactor 206 may be considered open. If the slope is within the range defined by $e_1$ and $e_2$ for each test value, the main contactor 206 may be considered closed. In the example, the test may be completed in 100 samples or 1 second.

The controller 250 may be configured to output, to a display of the user interface 160, a status indicator to indicate that the main contactor 206 is closed responsive to the rate of change of the voltage difference between the traction battery voltage and the high-voltage bus voltage over each of a predetermined number of time intervals being within a predetermined range. Values defining the predetermined range may be based on values of the capacitive element 229 and the discharge impedance 231 that are coupled to the high-voltage bus 152 through which the high-voltage bus 152 is discharged when the main contactor 206 is opened. The predetermined number of time intervals may define a duration that is less than a time for the high-voltage bus voltage to decay below a low-voltage threshold. The controller 250 may indicate a diagnostic code via the user interface 160 responsive to the rate of change of the voltage difference being less than the threshold. The rate of change may be evaluated between consecutive voltage measurements. The rate of change may be evaluated between averages of two groups of voltage differences that include more than one voltage measurement The controller 250 may be further programmed to, responsive to the rate of change of the voltage difference over each of a second predetermined number of time intervals falling outside of the predetermined range, cause the controller 250 to enter a shutdown mode and/or output the status indicator to indicate that the main contactor 206 is opened. The second predetermined number of time intervals may be different than the predetermined number of time intervals.

The rate of voltage decay depends on the RC time constant of the impedance coupled to the high-voltage bus 152. The magnitude of the rate of change of the voltage difference across the main contactor 206 may be expected to decrease over time since the voltage decay of the capacitance is an exponential function. The rate of change range may be selected based on an analysis of the RC circuit and the expected rate of change of the voltage difference over the first few seconds. The range values may be selected as values that are a predetermined percentage of the expected rate of change during the first few seconds after the main contactor 206 is opened.

When the main contactor 206 is closed, the voltage on each side of the main contactor 206 may change in a similar manner. The voltage on each side should rise and fall at approximately the same rate. When the main contactor 206 is open, the voltages on each side should be independent of one another. For example, the voltage on the traction battery side may remain steady, while the voltage on the high-voltage bus side may decay at some exponential rate defined by the impedance coupled to the high-voltage bus 152. As such, when the main contactor 206 is open, the magnitude of the rate of change of the voltage difference should exceed a threshold.

In some configurations, the system may implement a combination of strategies to determine the contactor status. While the above strategy allows fast detection when passive bus discharging is present, other strategies may be more effective when active discharging is available. As such, the power distribution system 200 may continue to compare the high-voltage bus voltage to a low-voltage threshold to detect when voltage rapidly decays to zero.

Figure 4:
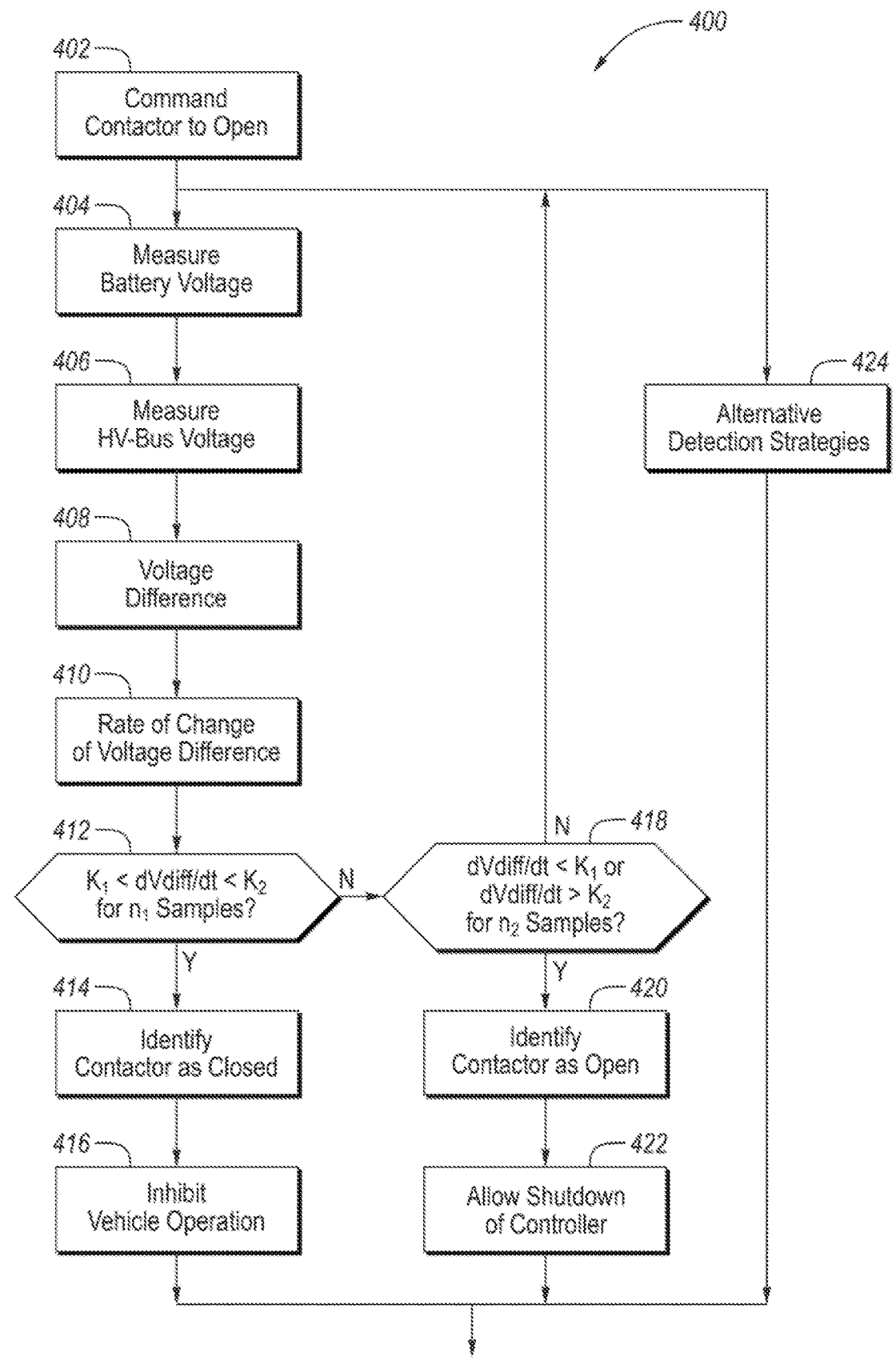
FIG. 4 depicts a flowchart for a possible sequence of operations for determining contactor status.

FIG. 4 depicts a flowchart for a possible sequence of operations for determining the contactor status. At operation 402, the controller 250 may command the main contactor 206 to open. Operations 404 through 422 may represent the contactor status identification strategy when only passive high-voltage bus discharging is available. Operation 424 may represent the contactor status identification when active discharging is available. The strategies may be executed in parallel or may be performed sequentially.

At operation 404, the controller 250 may measure the traction battery voltage. At operation 406, the controller 250 may measure the high-voltage bus voltage. At operation 408, the controller 250 may evaluate the difference between the traction battery voltage and the high-voltage bus voltage. For example, the controller 250 may implement instructions to subtract the traction battery voltage from the high-voltage bus voltage. The controller 250 may store the voltage differences over a predetermined amount of time. For example, the controller 250 may maintain a buffer of the voltage differences in memory.

At operation 410, the controller 250 may evaluate the rate of change or gradient of the voltage difference. For example, the controller 250 may implement instructions to evaluate equation (2) as described above. The rate of change values may be stored over a predetermined amount of time corresponding to the number of test intervals. At operation 412, the controller 250 may evaluate the condition for identifying a closed contactor. The controller 250 may implement instructions to evaluate equation (3) as described above. If the rate of change of the voltage difference is within a predetermined range (e.g., between $K_1$ and $K_2$) for a predetermined number of samples (e.g., $n_1$), the contactor may be identified as closed. If the closed contactor condition is satisfied, operation 414 may be performed. At operation 414, the contactor may be identified as closed. At operation 416, the controller 250 may inhibit vehicle operation. In addition, the controller 250 may store a diagnostic code to identify the issue. The controller 250 may further output a status indicator to the user interface for display in the vehicle. The controller 250 may cause a display of the user interface 160 to show a status indicator to indicate that the contactor is welded closed during a subsequent ignition cycle. The status indicator may also be immediately displayed on the user interface. However, it may be more likely to be viewed by the operator in the subsequent ignition cycle as the operator may have already departed the vehicle when the welded contactor is detected.

If the closed contactor conditions are not satisfied, operation 418 may be performed. At operation 418, the controller 250 may evaluate the conditions for identifying an open contactor. For example, the controller 250 may implement instructions to evaluate equation (4) as described above. If the rate of change of the voltage difference is outside of the predetermined range (e.g., defined by $K_1$ and $K_2$) for a predetermined number of samples (e.g., $n_2$), the contactor may be identified as opened. If the open contactor conditions are satisfied, operation 420 may be performed. At operation 420, the contactor may be identified as opened. At operation 422, the controller 250 may initiate shutdown of the controller 250 and vehicle systems to enter a low-power mode. The controller 250 may enter a shutdown mode without causing the user interface to show the status indicator for a welded contactor for the subsequent ignition cycle.

If the open contactor conditions are not satisfied at operation 418, the operations starting from operation 404 may be repeated.

Operation 424 may represent alternative contactor status detection strategies. For example, specific strategies may be designed for use when an active discharging element is present and operational. Operation 424 may be performed in parallel to operations 404 through 422. If the active discharge is successful, the high-voltage bus voltage may rapidly fall below the predetermined low-voltage threshold. The alternative strategy may rapidly identify the contactor status after an active discharge cycle and operate the vehicle and controller according to the identified contactor status.

The disclosed system allows for a faster and more dependable contactor status determination than those based only on a time duration. The weld check strategy allows for faster detection of welded contactor events when the active bus discharge feature is unavailable.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle comprising:
a traction battery;
a contactor configured to selectively electrically couple a terminal of the traction battery to a terminal of a high-voltage bus; and
a controller programmed to command the contactor to open at an end of an ignition cycle and, responsive to a rate of change of a voltage difference between the traction battery and the high-voltage bus for each of a first predetermined number of consecutive time intervals being within a predetermined range, cause a display to show a status indicator to indicate the contactor is welded closed during a subsequent ignition cycle, and, responsive to the rate of change for each of a second predetermined number of consecutive time intervals falling outside the predetermined range, enter a shutdown mode without causing the display to show the status indicator for the subsequent ignition cycle.

2. The vehicle of claim 1, wherein values defining the predetermined range are based on values of a resistance and a capacitance that are coupled to the high-voltage bus through which the high-voltage bus is passively discharged when the contactor is opened.

3. The vehicle of claim 1, wherein the first predetermined number of consecutive time intervals and the second predetermined number of consecutive time intervals each define a duration that is less than a time for a voltage of the high-voltage bus voltage to decay from a voltage of the traction battery to below a predetermined low-voltage threshold.

4. The vehicle of claim 1, wherein the controller is further programmed to store a diagnostic code responsive to the rate of change for each of the first predetermined number of consecutive time intervals being within the predetermined range.

5. The vehicle of claim 1, wherein the controller is further programmed to evaluate the rate of change between consecutive voltage measurements.

6. The vehicle of claim 1, wherein the second predetermined number of consecutive time intervals is less than the first predetermined number of consecutive time intervals.

7. The vehicle of claim 1, wherein the controller is further programmed to, responsive to a voltage of the high-voltage bus falling below a predetermined low-voltage threshold, enter the shutdown mode without causing the display to show the status indicator for the subsequent ignition cycle.

8. A power distribution system for a vehicle comprising:
a contactor configured to selectively electrically couple a terminal of a traction battery to a corresponding terminal of a high-voltage bus; and
a controller programmed to command the contactor to transition from closed to open and, responsive to a rate of change of a difference between an average of a first set of voltage differences between a traction battery voltage and a high-voltage bus voltage and an average of a second set of voltage differences between the traction battery voltage and the high-voltage bus voltage being within a predetermined range over each of a predetermined number of time intervals, cause a display in the vehicle to show a status indicator indicative of the contactor being welded closed.

9. The power distribution system of claim 8, wherein the first set of voltage differences are consecutive measurements over a first time interval and the second set of voltage differences are consecutive measurements over a second time interval.

10. The power distribution system of claim 9, wherein the second time interval immediately follows the first time interval.

11. The power distribution system of claim 9, wherein the first time interval and the second time interval each includes a same number of voltage measurements.

12. The power distribution system of claim 8, wherein values defining the predetermined range are based on values of a resistance and a capacitance that are coupled to the high-voltage bus through which the high-voltage bus is passively discharged when the contactor is opened.

13. The power distribution system of claim 8, wherein the predetermined number of time intervals defines a duration that is less than a time for the high-voltage bus voltage to decay to less than a predetermined low-voltage threshold.

14. The power distribution system of claim 8, wherein the controller is further programmed to, responsive to the rate of change over each of a second predetermined number of time intervals falling outside of the predetermined range, cause the controller to enter a low-power mode without causing the display to show the status indicator.

15. The power distribution system of claim 14, wherein the second predetermined number of time intervals is different than the predetermined number of time intervals.

16. A method comprising:
commanding, by a controller, a contactor disposed between a terminal of a traction battery and a terminal of a high-voltage bus to transition from closed to open; and
outputting, by the controller, to a display a status indicator indicative of a welded contactor responsive to a rate of change of a voltage difference between a traction battery and a high-voltage bus over each of a predetermined number of consecutive time intervals being within a predetermined range that varies according to values of a resistance and a capacitance that are coupled to the high-voltage bus through which the high-voltage bus passively discharges when the contactor is opened.

17. The method of claim 16 further comprising entering a controller shutdown mode without outputting the status indicator responsive to the rate of change of the voltage difference over each of a second predetermined number of consecutive time intervals falling outside of the predetermined range.

18. The method of claim 17, wherein the second predetermined number of consecutive time intervals is different than the predetermined number of consecutive time intervals.

19. The method of claim 16, wherein the predetermined number of consecutive time intervals defines a duration that is less than a time for the high-voltage bus voltage to decay below a low-voltage threshold.

* * * * *